United States Patent [19]
Honma

[11] Patent Number: 5,946,239
[45] Date of Patent: Aug. 31, 1999

[54] NON-VOLATILE SEMICONDUCTOR MEMORY DEVICE

[75] Inventor: Yoshikazu Honma, Kawasaki, Japan

[73] Assignee: Fujitsu Limited, Kanagawa, Japan

[21] Appl. No.: 09/042,638

[22] Filed: Mar. 17, 1998

[30] Foreign Application Priority Data

Aug. 11, 1997 [JP] Japan ..................................... 9-216526

[51] Int. Cl.⁶ ................................................. G11C 16/00
[52] U.S. Cl. ............................... 365/185.21; 365/185.09; 365/185.3
[58] Field of Search .......................... 365/185.11, 185.09, 365/185.3, 189.07, 189.08, 185.21

[56] References Cited

U.S. PATENT DOCUMENTS 4,775,958  10/1988  Hashimoto ......................... 365/185.09
5,568,426  10/1996  Roohparvar et al. ................. 365/185.3

*Primary Examiner*—Tan T. Nguyen
*Attorney, Agent, or Firm*—Nikaido Marmelstein Murray & Oram LLP

[57] ABSTRACT

A non-volatile semiconductor memory device includes a first memory cell array, a second memory cell array that can be accessed by an address identical to that for the first memory cell array, and a decision circuit which executes an operation on data stored in the first and second memory cell arrays and a predetermined fixed value, a result of the given operation being output data to be externally output.

10 Claims, 12 Drawing Sheets

FIG. 5

| TRUE VALUE | A | B | C | OUTPUT |
|---|---|---|---|---|
| 0 | 0 | 0 | 0 | 0 |
|   | 0 | 0 | 1 | 0 |
|   | 0 | 1 | 0 | 0 |
|   | 1 | 0 | 0 | 0 |
| 1 | 0 | 1 | 1 | 1 |
|   | 1 | 0 | 1 | 1 |
|   | 1 | 1 | 0 | 1 |
|   | 1 | 1 | 1 | 1 |

FIG. 10

| TRUE VALUE | A | B | FIXED VALUE | OUTPUT |
|---|---|---|---|---|
| 0 | 0 | 0 | 1 | 0 |
| 1 | 0 | 1 | 1 | 1 |
|   | 1 | 0 | 1 | 1 |
|   | 1 | 1 | 1 | 1 |

※ A : OUTPUT OF 1ST SENSE AMP 7
    B : OUTPUT OF 2ND SENSE AMP 8

FIG. 11

| TRUE VALUE | A | B | FIXED VALUE | OUTPUT |
|---|---|---|---|---|
| 0 | 0 | 0 | 0 | 0 |
| 0 | 0 | 1 | 0 | 0 |
| 0 | 1 | 0 | 0 | 0 |
| 1 | 1 | 1 | 0 | 1 |

※ A : OUTPUT OF 1ST SENSE AMP 7
  B : OUTPUT OF 2ND SENSE AMP 8

NON-VOLATILE SEMICONDUCTOR MEMORY DEVICE

BACKGROUND OF THE INVENTION

1. Field of the Invention

The present invention relates to a nonvolatile semiconductor memory device having a floating gate in which a charge corresponding to data is stored.

Nowadays, EPROM devices, EEPROMs and flash memory devices are known as non-volatile semiconductor memory devices. The non-volatile semiconductor memory devices has a structure in which a charge is injected into a floating gate of a memory cell and is drawn therefrom. Hence, data can be written into and read from the memory cell.

2. Description of the Related Art

A conventional non-volatile semiconductor memory device will be described with reference to FIG. 1, which shows a circuit configuration thereof directed to a data read operation. The circuit shown in FIG. 1 includes a memory cell array 101 having memory cell transistors 107, an address buffer 102, a word line (WL) decoder 103, a bit line (BL) decoder 104, a sense amplifier 105, and an output buffer 106. The address buffer 102 temporarily stores an address signal. The word line decoder 103 decodes the address and thus generates a voltage applied to the control gates of the memory cell transistors 107. The bit line decoder 104 decodes the address and thus generates a voltage applied to the drains of the memory cell transistors 107. The sense amplifier 105 includes sense amplifier circuits respectively provided for the bit lines. Each of the circuits compares a bit line current flowing in the corresponding memory cell transistor 107 with a predetermined reference current, and senses data stored in the memory cell. The output buffer outputs data. The sources of the memory cell transistors 107 are grounded.

The data stored in each memory cell transistor 107 depends on the presence/absence of a charge in the floating gate. When the memory cell transistor 107 stores data "0", the floating gate is charge with negative electricity due to the electrons charged therein. Even when voltages for the read operation are applied to the control gate and drain of the memory cell transistor 107, the drain current little flows because the threshold voltage is increased.

When data "1" is stored in the memory cell transistor 107, little electrons are present in the floating gate. Hence, the transistor 107 has a decreased threshold voltage and the drain current flows when voltages for the read operation are applied to the control gate and drain.

The data read operation of the device shown in FIG. 1 is carried out as follows by utilizing the above operation of the memory cell transistor 107.

When an address is applied to the address buffer 102, the word line decoder 103 selects one of the word lines, and the bit line decoder 104 selects one of the bit lines. Hence, one memory cell transistor 107 connected by the selected word line and bit line is selected. When the voltages are applied to the control gate and drain of the selected memory cell transistor 107, the drain current flows in the bit line. At that time, some memory cell transistors are connected to the selected bit line in which the above drain current flows. However, these memory cell transistors are not selected because the corresponding word lines are not selected. Hence, ideally, the bit line current consists of only the drain current of the selected transistor 107, and is not affected by the memory cell transistors 107 connected to the same bit line as the selected transistor 107.

The sense amplifier 105 compares the bit line current flowing in the bit line to which the selected cell is connected with the reference current, and thus determines whether data "0" or data "1" is stored in the memory cell transistor 107. As shown in FIG. 2, the reference current is proportional to the voltage applied to the control gate. The sense amplifier 105 compares the bit line current of the memory cell transistor 107 obtained when the voltage of a read level is applied to the control gate with the reference current. When the bit line current is greater than the reference current, sense amplifier 105 senses "1". When the bit line current is less than the reference current, sense amplifier 105 senses "0". The output buffer 106 outputs data based on the sensed result from the sense amplifier 105.

It is required to determine the reference current taking into account an over erase effect of the memory cells having the floating gates. In the case where data is read from a selected memory cell 107, if there is an over-erased cell connected to the bit line to which the selected cell is connected, a drain current will flow in the over-erased cell although the over-erased cell is not selected. Of course, no drain currents flow in all the other normal, non-selected cells connected to the selected bit line. Hence, the current flowing in the bit line to which the selected memory cell transistor 107 is connected includes not only the drain current of the selected transistor 107 but also the drain currents of the over-erased transistors. Hence, as indicated by solid arrows in FIG. 3, an increased amount of the current flows in the bit line, and greatly deviates from the original level illustrated by a broken line, irrespective of whether the selected memory cell transistor 107 stores "1" or "0".

With the above in mind, the amount of the reference current is selected so that it is not equal to half the difference between the drain current for "1" and the drain current for "0" but is closer to the drain current for "1", as shown in FIG. 2.

However, the above setting of the reference current will be affected by a charge gain effect in which the number of electrons in the floating gate increases with elapse of time. Due to the charge gain effect, there is a possibility that the sense amplifier 105 may mistakenly read data stored in the selected memory cell transistor 107 so that it reads "0" although "1" is actually stored.

In order to improve the reliability of the non-volatile semiconductor memory devices, a particular arrangement is employed. For example, as shown in FIG. 4, the memory cell array 101 is segmented in memory cell arrays 101a, 101b and 101c. A majority decision circuit 108 receives data read from the arrays 101a, 101b and 101c. The memory cell arrays 101a, 101b and 101c have an identical address area and store identical data. The output data of the majority decision circuit 108 is the output data of the non-volatile semiconductor memory device.

FIG. 5 shows the truth table of the majority decision circuit 108. As shown in FIG. 5, the majority decision circuit 108 outputs "0" when the output signals of the memory cell arrays 101a, 101b and 101c are any of "000", "001", "101" and "100", and outputs "1" when the outputs are "011", "101", "110" and "111". Hence, even if the read data from one of the memory cell arrays 101a, 101b and 101c happens to be changed, the erroneous data is finally corrected and output by the majority decision circuit 108. Hence, the reliability of the device can be improved. As an increased number of segmented memory cell arrays is employed, more improved reliability can be obtained.

However, as the reliability of the device is improved, an increased number of segmented arrays occupy an increased area on the chip.

SUMMARY OF THE INVENTION

It is an object of the present invention to provide a non-volatile semiconductor memory device in which the above disadvantage is eliminated.

A more specific object of the present invention is to provide a non-volatile semiconductor memory device having increased reliability of output data without an increase in a chip area.

The above objects of the present invention are achieved by a non-volatile semiconductor memory device comprising: a first memory cell array; a second memory cell array that can be accessed by an address identical to that for the first memory cell array; and a decision circuit which executes a given operation on data stored in the first and second memory cell arrays and a predetermined fixed value, a result of the given operation being output data to be externally output.

The above non-volatile semiconductor memory device may be configured so that: the fixed value is set equal to a first data value which may mistakenly be changed to a second data value with a possibility higher than the second data value may be changed to the first data value; and the decision circuit makes a majority decision on the data stored in the first and second memory cell arrays and the fixed value, so that an error in which the first data value is changed to the second data value can be corrected.

The non-volatile semiconductor memory device may be configured so that: the data stored in the first and second memory cell arrays is arranged so as to have performance so that a first data value may mistakenly be changed to a second data value with a possibility higher than the second data value may be changed to the first data value; the fixed value is set equal to the first data value; and the decision circuit makes a majority decision on the data stored in the first and second memory cell arrays and the fixed value, so that an error in which the first data value is changed to the second data value can be corrected.

The non-volatile semiconductor memory device may be configured so that it further comprises: a failure address memory circuit which stores an address of a defective memory cell transistor which is located in one of the first and second memory cell arrays; and a compare circuit which compares the address stored in the failure address memory circuit with the address externally supplied and determines whether both addresses coincide with each other, the decision circuit changing the fixed value to another fixed value if the compare circuit determines that both the addresses coincide with each other.

The non-volatile semiconductor memory device may further comprise: a failure address memory circuit which stores an address of a defective memory cell transistor which is located in one of the first and second memory cell arrays; and a compare circuit which compares the address stored in the failure address memory circuit with the address externally supplied and determines whether both addresses coincide with each other, the decision circuit changing the fixed value from the first data value to the second data value if the compare circuit determines that both the addresses coincide with each other.

The above objects of the present invention are also achieved by a non-volatile semiconductor memory device comprising: a first memory cell array; a second memory cell array that can be accessed by an address identical to that for the first memory cell array; and a logic gate which executes a given logic operation on data stored in the first and second memory cell arrays, wherein the data stored in the first and second memory cell arrays is arranged so as to have performance so that a first data value may mistakenly be changed to a second data value with a possibility higher than the second data value may be changed to the first data value, a result of the given logic operation being output data to be externally output.

The above non-volatile semiconductor memory device may be configured so that the logic gate is an OR gate.

The non-volatile semiconductor memory device may be configured so that the logic gate is an AND gate.

The non-volatile semiconductor memory device may be configured so that the logic gate comprises: an OR gate performing an OR operation on the data stored in the first and second memory cell arrays; an AND gate performing an AND operation on the data stored in the first and second memory cell arrays; and a selector which selects one of results of the OR and AND gates, a selected result being output data to be externally output.

BRIEF DESCRIPTION OF THE DRAWINGS

Other objects, features and advantages of the present invention will become more apparent from the following detailed description when read in conjunction with the accompanying drawings, in which:

FIG. 5 shows a truth table of a majority decision circuit shown in FIG. 4;

FIG. 10 shows a truth table of the majority decision made when the fixed value is equal to "1";

FIG. 11 shows a truth table of the majority decision made when the fixed value is equal to "0";

DESCRIPTION OF THE PREFERRED EMBODIMENTS

A description will be given of embodiments of the present invention having an arrangement in which data is stored due to the presence/absence of a charge in the floating gate of the memory cell transistor and an error is corrected by a majority decision circuit.

Figure 6:
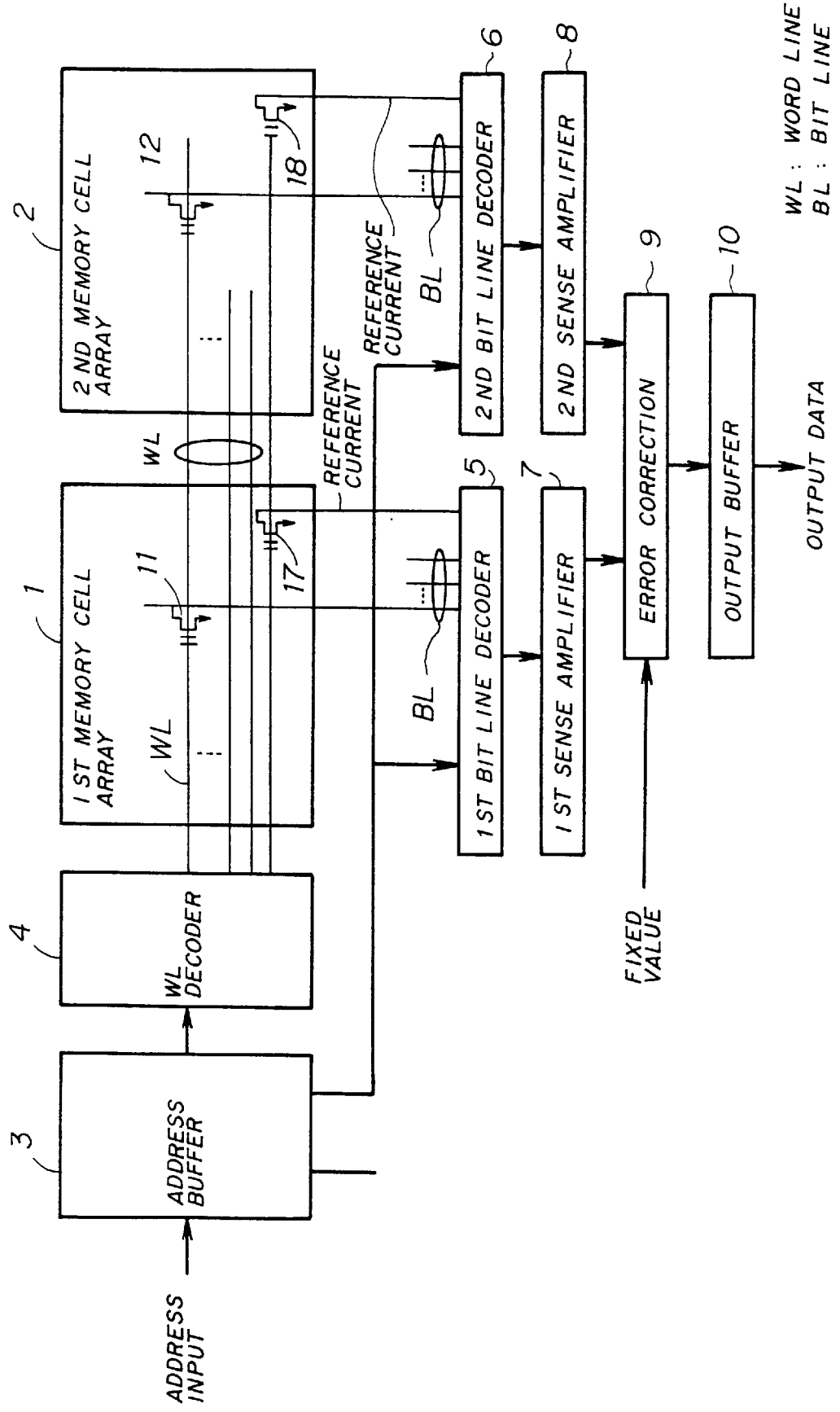
FIG. 6 is a block diagram of a first embodiment of the present invention.

FIG. 6 is a block diagram of a first embodiment of the present invention. The non-volatile semiconductor memory device shown in FIG. 6 includes a first memory cell array 1, a second memory cell array 2, an address buffer 3, a word line decoder 4, a first bit line decoder 5, a second bit line decoder 6, a first sense amplifier 7, a second sense amplifier 8, an error correction circuit 9, and an output buffer 10. The device has a one-bit data error correction function, as will be described later.

The first memory cell array 1 includes memory cell transistors 11 and a reference cell transistor 17, these transistors respectively have floating gates in which charges can be stored. The memory cell transistors 11 have control gates connected to word lines, drains supplied with a given read voltage when data is read, and sources grounded. A given voltage is applied, via the word lines WL, to the control gates of the transistors 11 in order to select the transistors 11. The reference cell transistor 17 generates a reference current used to determine the values of data stored in the memory cell transistors 11 when reading the data therefrom.

The second memory cell array 2 includes memory cell transistors 12 and a reference cell transistor 18, and has the same address space or area as that of the first memory cell array 1. The first and second memory cell arrays 1 and 2 can store identical data. The memory cell transistors 12 are connected in the same manner as the above-mentioned memory cell transistors 11. The reference cell transistor 18 generates a reference current used to determine the values of data stored in the memory cell transistors 12 when reading the data therefrom.

The address buffer 3 temporarily stores an address externally supplied when data is read therefrom. The word line decoder 4 decodes the address temporarily stored in the address buffer 3, and generates a voltage applied to the control gates of the memory cell transistors 11 and 12 selected by the decoded row address. The first bit line decoder 5 decodes the address in the address buffer 3, and generates a voltage applied to the drains of the memory cell transistors 11 selected by the decoded column address. The second bit line decoder 6 decodes the address in the address buffer 3, and generates a voltage applied to the drains of the memory cell transistors 12 selected by the decoded column address.

The first sense amplifier 7 compares the bit line current flowing in the selected memory cell transistor 11 with the reference current flowing in the reference cell transistor 17, and determines the value of the data stored in the selected memory cell transistor 11. The second sense amplifier 8 compares the drain current flowing in the selected memory cell transistor 12 with the reference current flowing in the reference cell transistor 18, and determines the value of the data stored in the selected memory cell transistor 12.

The error correction circuit 9 makes a majority decision on the data values sensed by the first and second sense amplifiers 7 and 8 with a predetermined constant value, and outputs, via the output buffer 10, the result of the majority decision to the outside of the device as output data.

The presence and absence of charge in the floating gate correspond to data "0" and "1", respectively. More particularly, when the memory cell transistor 11 stores "0", the floating gate thereof is charged with negative electricity due to the electrons injected therein. Hence, the memory cell transistor 11 has an increased threshold voltage, and the drain current little flows therein even when the voltages are applied to the control gates and drain thereof.

When the memory cell transistor 11 stores "1", the floating gate thereof little has electrodes. Hence, the memory cell transistor 11 has a decreased threshold voltage, and the drain current flows therein when the voltages are applied to the control gate and drain of the memory cell transistor 11.

Data stored in the memory cell transistors 11 can be read due to the different operations thereof as described above. The above holds true for the memory cell transistors 12 of the second memory cell array 2.

A description will now be given of a data read operation of the device shown in FIG. 6.

When the address allocated to the memory cell transistors 11 is stored in the address buffer 3, the word decoder 4 and the first bit line decoder 5 decodes the address, and selects the corresponding word line and bit line from among the word lines WL and the bit lines BL. Hence, one memory cell transistor 11 is selected. Simultaneously, the second bit line decoder 6 decodes the address stored in the address buffer 3, and selects the memory cell transistor 12 having the same address space as that of the selected memory cell transistor 11.

The voltage is applied to the control gates of the memory cell transistors 11 connected to the word line selected by the word line decoder 4, and the voltage is applied to the drains of the memory cell transistors 11 connected to the bit line selected by the first bit line decoder 5. Hence, the drain current flows in the bit line connected to the selected memory cell transistor 11. Simultaneously, the voltage is applied to the drains of the memory cell transistors 12 connected to the bit line selected by the second bit line decoder 6. Hence, the drain current flows in the bit line connected to the selected memory cell transistor 12.

It will be noted that some memory cell transistors 11 other than the selected memory cell transistor 11 are connected to the selected bit line, and some memory cell transistors 12 other than the selected memory cell transistor 12 are connected to the selected bit line. However, these transistors are not selected because the corresponding word lines are not selected. Hence, ideally, the bit line currents flowing in the respective selected bit lines consist of only the corresponding drain currents of the selected memory cell transistors 11 and 12, and the other cells connected to the selected bit lines are not affected by the memory cell transistors 11 and 12 which are not selected.

The first sense amplifier 7 compares the bit line current of the selected memory cell transistor 11 with the reference current flowing in the reference cell transistor 17 when data is read, and determines whether data "0" or "1" is stored therein.

Figure 1:
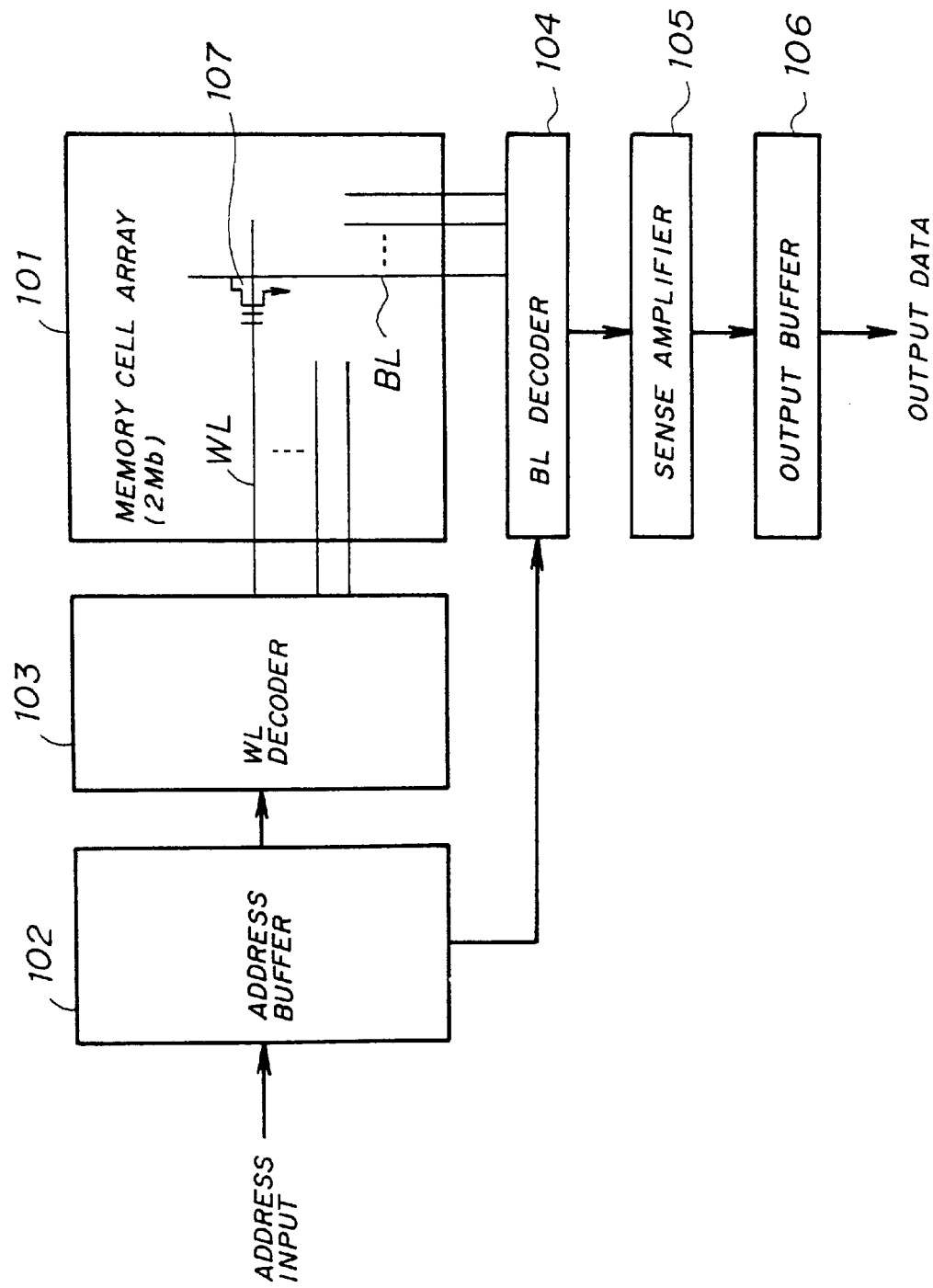
FIG. 1 is a block diagram of a conventional non-volatile semiconductor memory device.
Figure 2:
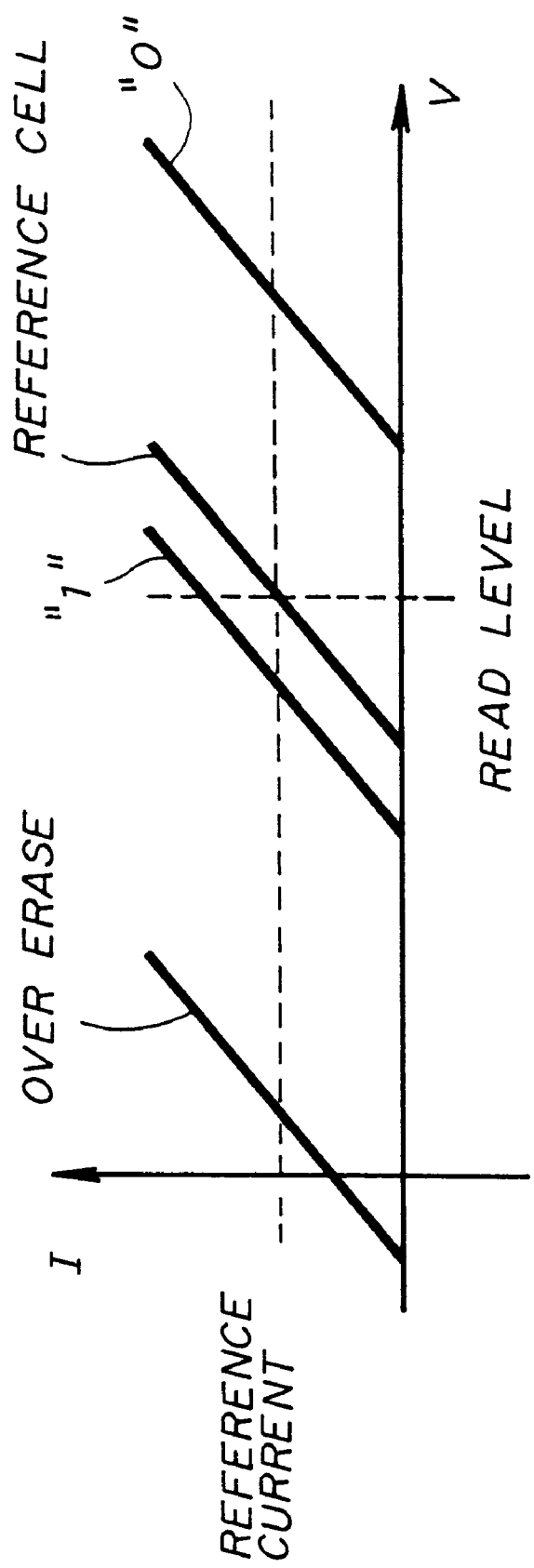
FIG. 2 is a graph showing a relationship between a control gate voltage and a drain current of a memory cell transistor.

The reference current flowing in the reference cell transistor 17 is proportional to the voltage applied to the control gate thereof, as shown in FIG. 2. The first sense amplifier 7 compares the bit line current flowing in the selected memory cell transistor obtained when the voltage is applied to the gate thereof with the reference current. When the bit line current of the memory cell transistor 11 is greater than the reference current, the first sense amplifier 7 senses data "1". When the bit line current of the memory cell transistor 11 is less than the reference current, the first sense amplifier 7 senses data "0".

Simultaneously, the second sense amplifier 8 compares the drain current of the selected memory cell transistor 12 with the reference current flowing in the reference cell transistor 18. Then, the sense amplifier 8 senses data "1" or "0" in the same manner as described above. More particularly, the reference current flowing in the reference cell transistor 18 is proportional to the voltage applied to the control gate thereof, as shown in FIG. 2. The second sense amplifier 8 compares the bit line current flowing in the selected memory cell transistor obtained when the voltage is applied to the gate thereof with the reference current. When the bit line current of the memory cell transistor 12 is greater than the reference current, the second sense amplifier 8 senses data "1". When the bit line current of the memory cell transistor 12 is less than the reference current, the second sense amplifier 8 senses data "0".

In the above manner, identical data are read from the first memory cell array 1 and the second memory cell array 2.

Figure 3:
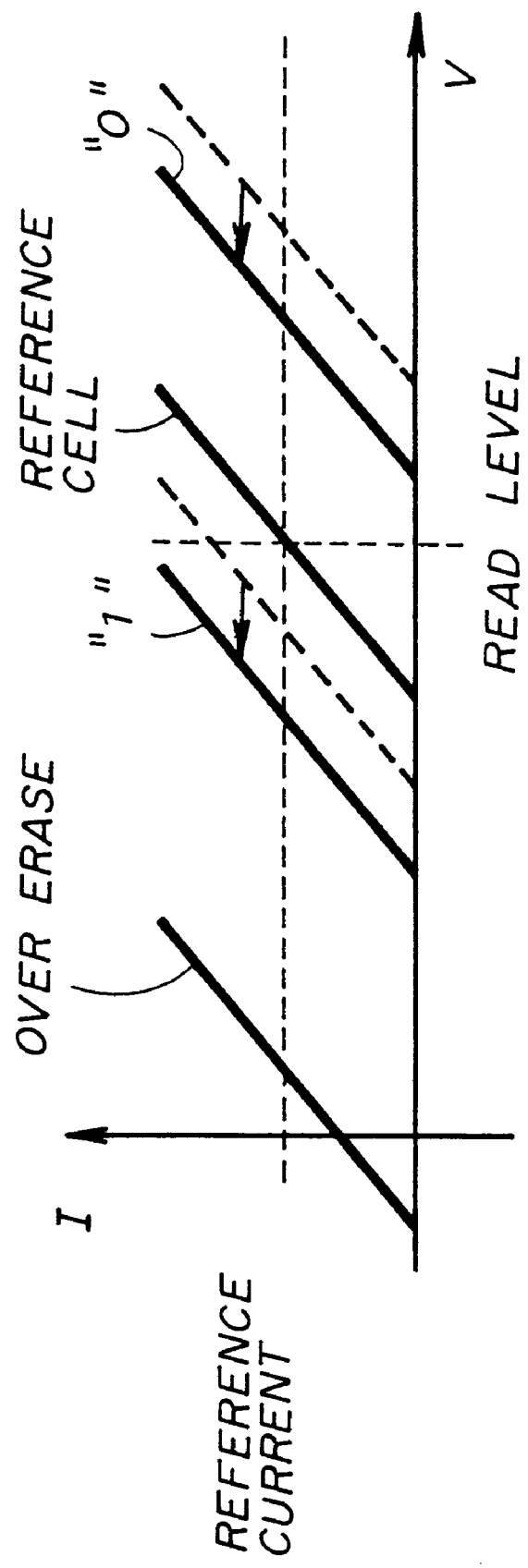
FIG. 3 is a graph showing a relationship between the control gate voltage of the memory cell transistor and a current flowing in a bit line.
Figure 4:
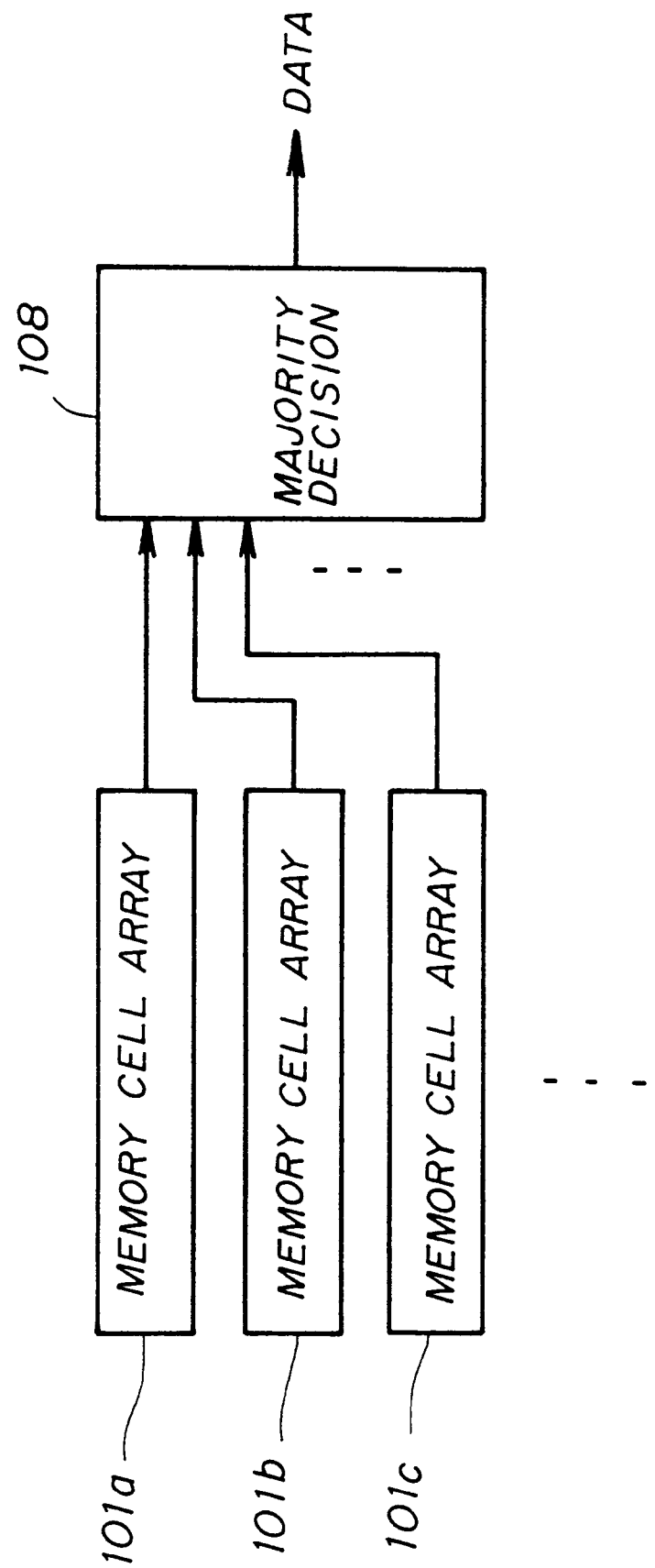
FIG. 4 is a block diagram of an error correction mechanism employed in the conventional non-volatile semiconductor memory device.

However, in practice, the above data read operation may be affected by the aforementioned over erase effect. More particularly, in the case where data is read from the selected memory cell transistor 11, if there is an over-erased cell connected to the bit line to which the selected cell is connected, a drain current will flow in the over-erased cell although the over-erased cell is not selected. Of course, no drain currents flow in all the other normal, non-selected cells connected to the selected bit line. Hence, the current flowing in the bit line to which the selected memory cell transistor 11 is connected includes not only the drain current of the selected transistor 11 but also the drain currents of the over-erased transistors. Hence, as indicated by the solid arrows in FIG. 3, an increased amount of the current flows in the bit line, and greatly deviates from the original level illustrated by the broken line, irrespective of whether the selected memory cell transistor 11 stores "1" or "0".

With the above in mind, the amount of the reference current is selected so that it is not equal to half the difference between the drain current for "1" and the drain current for "0" but is closer to the drain current for "1", as shown in FIG. 2.

However, the above setting of the reference current will be affected by the aforementioned charge gain effect in which the number of electrons in the floating gate increases with elapse of time. Due to the charge gain effect, there is a possibility that the sense amplifier 7 may mistakenly read data stored in the selected memory cell transistor 11 so that it reads "0" although "1" is actually stored.

The above holds true for the memory cell transistors 12 of the second memory cell array 2.

According to the first embodiment of the present invention, the error correction circuit 9 executes a one-bit data correcting operation on the data output by the first sense amplifier 7, the data output by the second sense amplifier 8 and a predetermined fixed value. The one-bit data correcting operation will now be described with reference to FIGS. 7 through 11.

Figure 7:
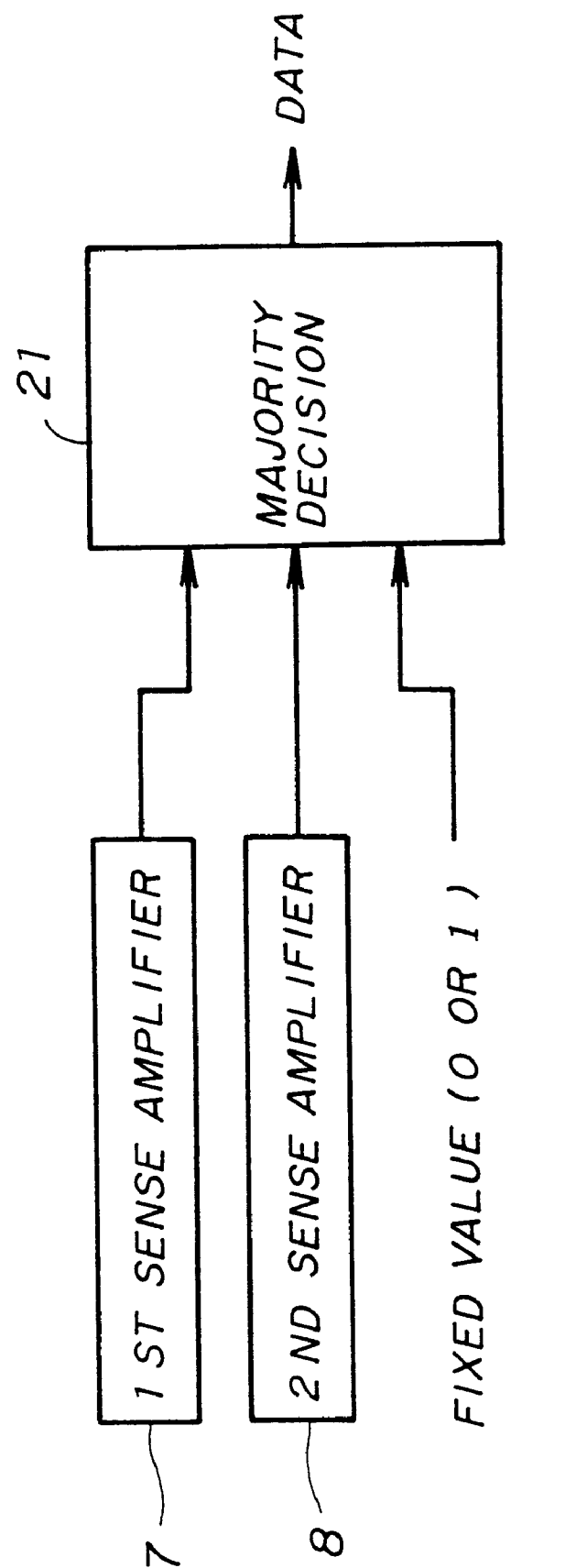
FIG. 7 is a block diagram of an internal structure of an error correction circuit shown in FIG. 6.

Referring to FIG. 7, the error correction circuit 9 is formed of a majority decision circuit 21, which executes a majority operation on the output data of the first and second sense amplifiers 7 and 8 and the fixed value. The result of the majority decision is the output data of the non-volatile semiconductor memory device. The fixed value is selected by taking into consideration the following.

When the reference current is set closer to the drain current of the memory cell transistors 11 and 12 flowing when data "1" is stored therein, data "1" may erroneously be sensed by the sense amplifiers 7 and 8 although data "0" is actually stored therein. However, there is substantially no possibility that data "0" may erroneously be sensed by the sense amplifiers 7 and 8 although data "1" is actually stored therein due to the "offset" reference current. In other words, the above setting of the reference current functions to restrict the type of error. As a result, it can be recognized that data "1" may have the possibility of occurrence of error while data "0" does not have any possibility of occurrence of error in the case where the reference current is set closer to the drain current flowing when data "1" is stored.

Hence, only data "1" may require the error correction and is applied to the majority decision circuit 21 as the fixed value. In a case where data "1" is stored in the selected memory cell transistors 11 and 12, even if the data from one of the two memory cell transistors 11 and 12 is erroneously sensed as "0", the result of the majority decision circuit 21 is "1". That is, the erroneous data "0" is corrected and the correct data "1" is output. When the selected memory cell transistors 11 and 12 store data "0", there is substantially no possibility that data may mistakenly be read as "1". Hence, the result of the majority decision made including the fixed value "1" is "0".

Figure 8:
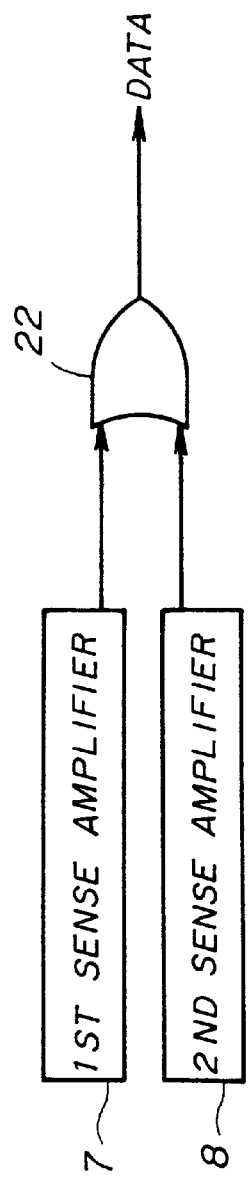
FIG. 8 is a block diagram of an error correction arrangement employed when a fixed value is equal to "1"

When the fixed value is "1", as shown in FIG. 10, the result of the majority decision is "0" when the data outputs from the first and second sense amplifiers 7 and 8 are respectively "00", and the result thereof is "1" when the data outputs from the first and second sense amplifiers 7 and 8 are respectively "01", "10" and "11". The above logic of the majority decision circuit 21 can be implemented by an OR gate 22, as shown in FIG. 8. The OR gate 22 executes an OR operation on the data outputs of the first and second sense amplifiers 7 and 8.

If the reference current is set closer to the drain current flowing in the memory cell transistor storing data "0", data "0" may mistakenly be sensed as data "1" due to a charge loss effect in which the number of electrons stored in the floating gate is reduced with elapse of time. In contrast, there is substantially no possibility that data "1" may mistakenly be sensed as data "0". That is, the above offset setting of the reference current restricts the type of error. As a result, it can be recognized that data "0" may have the possibility of occurrence of error while data "1" does not have any possibility of occurrence of error in the case where the reference current is set closer to the drain current flowing when data "0" is stored.

Hence, only data "0" may require the error correction and is applied to the majority decision circuit 21 as the fixed value. In a case where data "0" is stored in the selected memory cell transistors 11 and 12, even if the data from one of the two memory cell transistors 11 and 12 is erroneously sensed as "1", the result of the majority decision circuit 21 is "0". That is, the erroneous data "1" is corrected and the correct data "0" is output. When the selected memory cell transistors 11 and 12 store data "1", there is substantially no possibility that data may mistakenly be read as "0". Hence, the result of the majority decision made including the fixed value "0" is "1".

Figure 9:
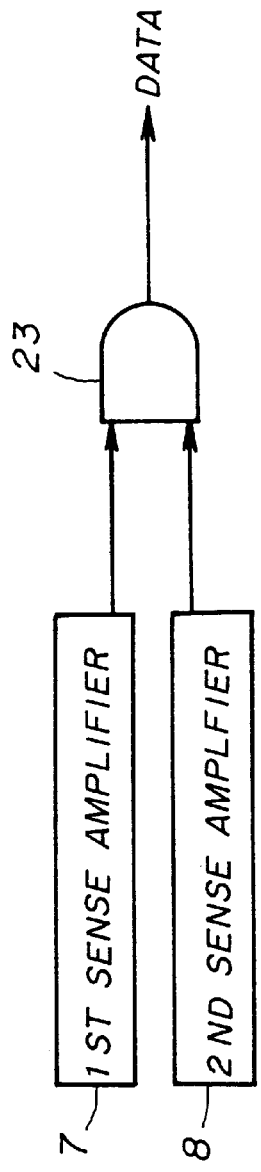
FIG. 9 is a block diagram of an error correction arrangement employed when the fixed value is equal to "0"

When the fixed value is "0", as shown in FIG. 11, the result of the majority decision is "1" when the data outputs from the first and second sense amplifiers 7 and 8 are respectively "11", and the result thereof is "0" when the data outputs from the first and second sense amplifiers 7 and 8 are respectively "00", "01" and "10". The above logic of the majority decision circuit 21 can be implemented by an AND gate 23, as shown in FIG. 9. The AND gate 23 executes an AND operation on the data outputs of the first and second sense amplifiers 7 and 8.

As described above, according to the first embodiment of the present invention, data which may mistakenly be sensed is applied, as the fixed value, to the majority decision circuit 21. Instead of the majority decision, a minority decision may be made in which data which does not have any possibility in which data may mistakenly be sensed is used as the fixed value. The data having minority is output from the memory device as output data.

The above-mentioned error correction employed in the first embodiment of the present invention provides the following advantages, as compared to the conventional non-volatile semiconductor memory device.

Regarding the prior art non-volatile semiconductor memory device, it will now be assumed that the probability "p" that data error may occur due to the charge gain after elapse of a given aging period is expressed as $p=1*10^{-8}$. The probability that there is no error is equal to $1-p$. Thus, the probability that the memory cell array of A bits does not have any error at all is equal to $(1-p)^A$ Hence, an error ratio P1 in which at least one bit among the A bits is erroneous is written as follows:

$$P1=1-(1-p)^A.$$

In contrast, regarding the present invention, if the probability that two bits accessed by the same address are both erroneous is denoted as $p^2$ after elapse of the given aging period, the probability that at least one of the two bits is normal is $1-p^2$. The probability that at least one bit of each of all pairs of bits among two sets of A bits accessed by the same address is normal is equal to $(1-p^2)^A$. Hence, the probability P2 that both of bits in one of pairs of bits among the two sets of A bits accessed by the same address are erroneous is written as follows:

$$P2=1-(1-p2)^A.$$

When A=1 Mbits, then the error ratios P1 and P2 are as follows:

$$P1=1.04*10^{-2}$$

$$P2=1.16*10^{-10}.$$

When A=1 Gbits, then the error ratios P1 and P2 are as follows:

$$P1=1.00*10^{-2}$$

$$P2=1.19*10^{-7}.$$

It can be seen from the above that the error ratio can drastically be reduced according to the present invention.

A description will now be given of a second embodiment of the present invention, which has a one-bit error correcting function under a situation in which one of the memory cell transistors accessed by the same address is defective.

Figure 12:
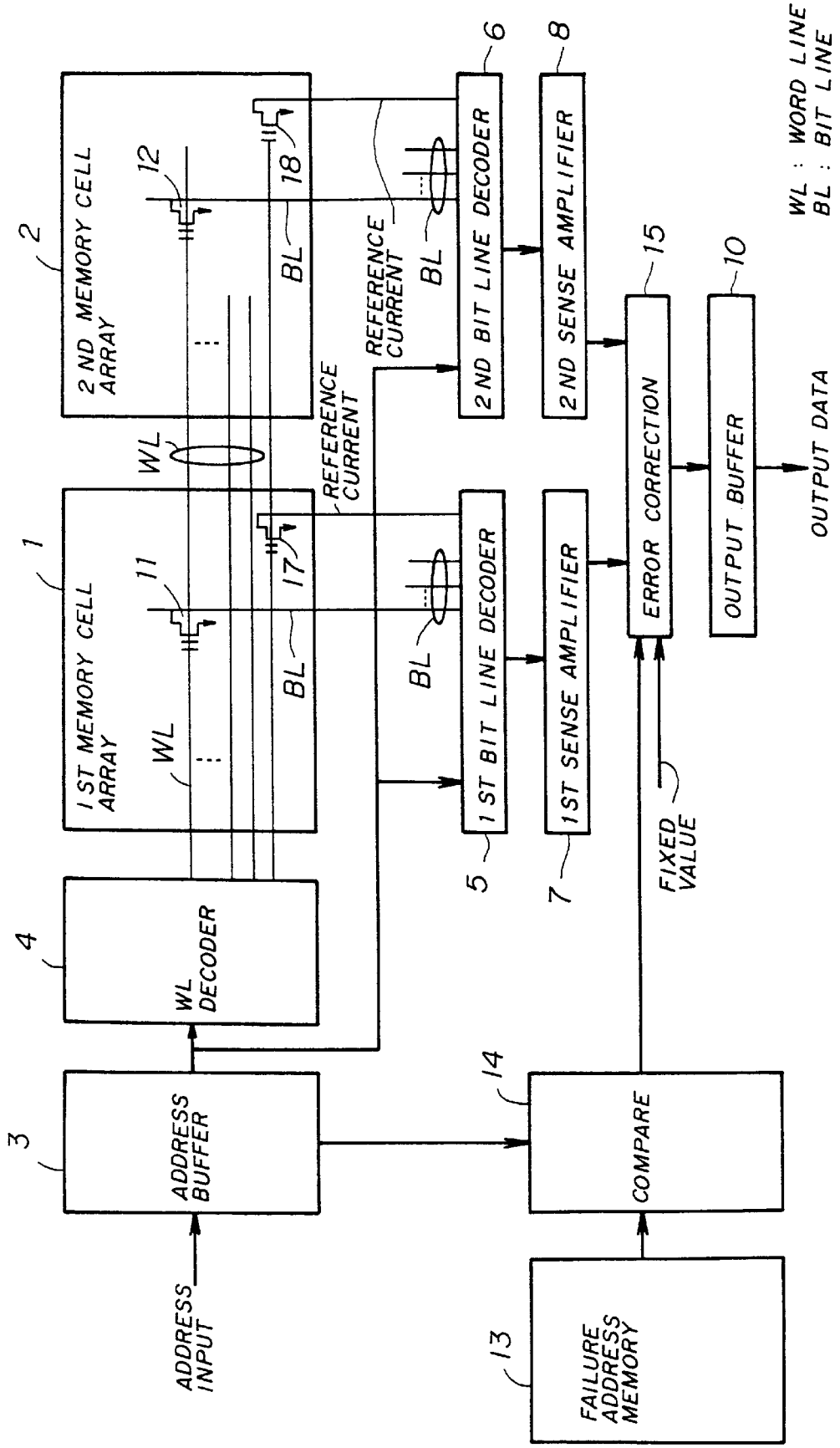
FIG. 12 is a block diagram of a second embodiment of the present invention.

FIG. 12 is a block diagram of a non-volatile semiconductor memory device according to the second embodiment of the present invention. In FIG. 12, parts that are the same as those shown in the previously described figures are given the same reference numbers. The device shown in FIG. 12 includes the first memory cell array 1, the second memory cell array 2, the address buffer 3, the word line decoder 4, the first bit line decoder 5, the second bit line decoder 6, the first sense amplifier 7, the second sense amplifier 8, and the output buffer 10.

The structure shown in FIG. 12 differs from that shown in FIG. 6 in the following. An error correction circuit 15 is substituted for the error correction circuit 9. A failure address memory circuit 13 and a compare circuit 14 are newly provided in the structure shown in FIG. 12.

The failure address memory circuit 13 stores the address of a defective memory cell transistor, which cannot store data, for example. The match circuit 14 compares the address of each defective memory cell transistor with the input address supplied via the address buffer 3, and generates a coincidence signal when both the addresses coincide with each other.

The error correction circuit 15 changes the predetermined fixed value on the basis of the coincidence signal supplied from the compare circuit 14, and makes the majority decision on the changed fixed value and the values of data respectively sensed by the first and second sense amplifiers 7 and 8. The result of the majority decision made by the error correction circuit 15 is data to be output from the memory device.

Figure 13:
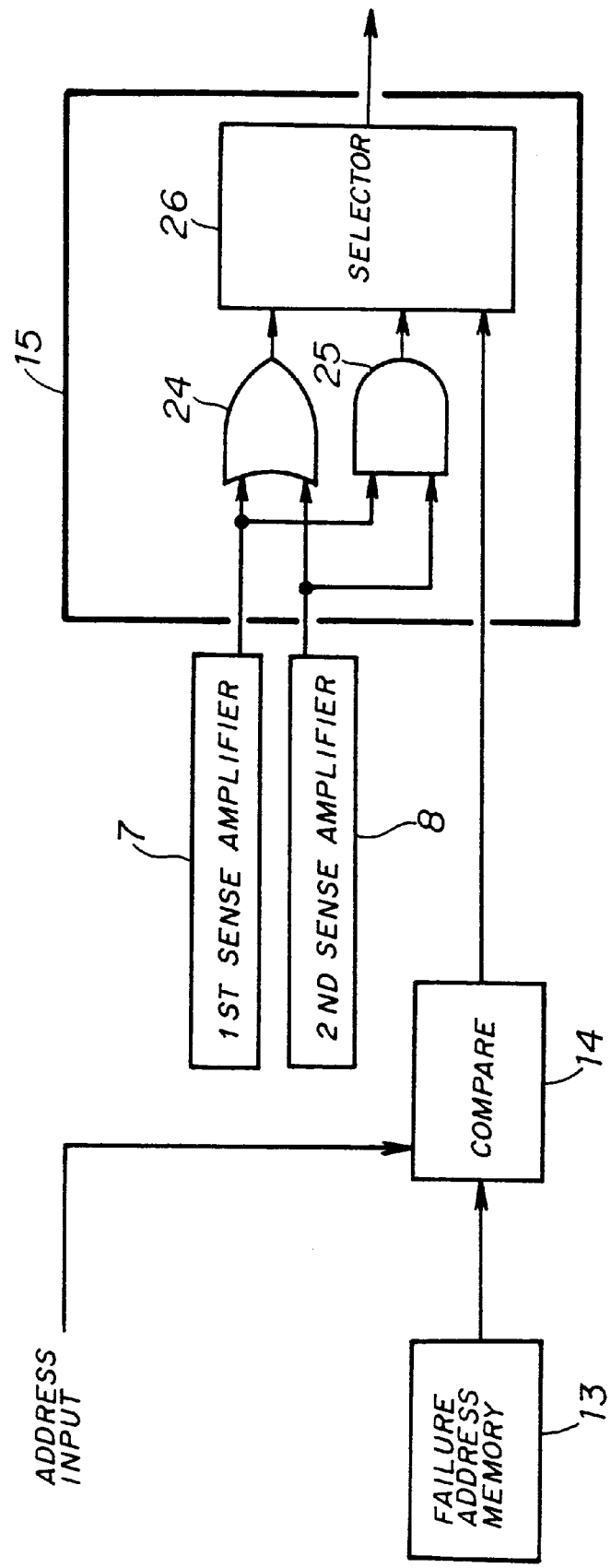
FIG. 13 is a block diagram of an internal structure of an error correction circuit shown in FIG. 12.

FIG. 13 shows an internal structure of the majority decision circuit 15 employed in the second embodiment of the present invention. It will now be assumed that the memory cell transistors 11 and 12 shown in FIG. 12 can be accessed by the same address and the transistor 11 is defective. The address of the defective transistor 11 is written into the failure address memory circuit 13. It will further be assumed that data "1" is written into the memory cell transistors 11 and 12 but data "0" stored in the defective transistor 11 is sensed as "0". Hence, the address of the defective transistor 11 is stored in the failure address memory circuit 13.

When data is read from the memory cell transistors 11 and 12, the corresponding address is applied to the compare circuit 14 via the address buffer 3, and is then compared with each address stored in the failure address memory circuit 13. In the example being considered, the address from the address buffer 3 coincides with one of the addresses stored in the failure address memory circuit 13. Hence, the compare circuit 14 changes the coincidence flag from "0" to "1".

The error correction circuit 15 changes the fixed value from "0" to "1" so that output data "1" is output. Then, the error correction circuit 15 makes a majority decision on the sensed data values "0" and "1" and the fixed value "1". The above logic can be implemented by an OR gate 24 and an AND gate 25, each of gates receives the sensed data from the first and second sense amplifiers 7 and 8, as shown in FIG. 13. A selector circuit 26 of the error correction circuit 15 selects the OR gate 24 when receiving the coincidence flag "1".

As described above, even if one of the two transistors accessed by the same address is defective so that data "1" cannot be written or stored, the error correction is still made by changing the fixed value used for the majority decision.

It will now be assumed that data "0" is written into the memory cell transistors 11 and 12 accessed by the same address in which one of these transistors is defective, so that the sensed data values are "01" or "10". The address of the above transistors 11 and 12 is stored in the failure address memory circuit 13. When the fixed value is equal to "0", the result of the majority decision is as shown in FIG. 11. When the fixed value is equal to "1", the result of the majority decision is as shown in FIG. 10. Thus, erroneous data "1" is output with the fixed value equal to "1".

When the input address indicating the memory cell transistors 11 and 12 is applied to the compare circuit 14 via the address buffer 3 (FIG. 12), the compare circuit 14 changes the coincidence flag to "1". In response to receipt of the coincidence flag "1", the error correction circuit 15 changes the fixed value from "1" to "0" so that output data "0" can be obtained. That is, the error correction circuit 15 makes the majority decision on the sensed data values "0" and "1" and the fixed value "0". The above logic can be implemented by the AND gate 25 shown in FIG. 13. That is, if one of the two memory cell transistors accessed by the same address is defective and data "0" is written or stored therein, the AND gate 25 is selected to output the output data.

As described above, even if one of the two transistors accessed by the same address is defective so that data "0" cannot be written or stored, the error correction is still made by changing the fixed value used for the majority decision.

Even in the second embodiment of the present invention, a minority decision can be made in which the fixed value is different from that used in the majority decision.

The present invention is not limited to the specifically disclosed embodiments, and variations and modifications may be made without departing from the scope of the present invention.

What is claimed is:

1. A non-volatile semiconductor memory device comprising:
    a first memory cell array;
    a second memory cell array that can be accessed by an address identical to that for the first memory cell array; and
    a decision circuit which executes an operation on data stored in the first and second memory cell arrays and a predetermined fixed value, a result of the operation being output data to be externally output.

2. The non-volatile semiconductor memory device as claimed in claim 1, wherein:
    the fixed value is set equal to a first data value which may mistakenly be changed to a second data value with a possibility higher than the second data value may be changed to the first data value; and
    the decision circuit makes a majority decision on the data stored in the first and second memory cell arrays and the fixed value, so that an error in which the first data value is changed to the second data value can be corrected.

3. The non-volatile semiconductor memory device as claimed in claim 2, further comprising:
    a failure address memory circuit which stores an address of a defective memory cell transistor which is located in one of the first and second memory cell arrays; and
    a compare circuit which compares the address stored in the failure address memory circuit with the address externally supplied and determines whether both addresses coincide with each other,
    the decision circuit changing the fixed value from the first data value to the second data value if the compare circuit determines that both the addresses coincide with each other.

4. The non-volatile semiconductor memory device as claimed in claim 1, wherein:
    the data stored in the first and second memory cell arrays is arranged so as to have performance so that a first data value may mistakenly be changed to a second data value with a possibility higher than the second data value may be changed to the first data value;
    the fixed value is set equal to the first data value; and
    the decision circuit makes a majority decision on the data stored in the first and second memory cell arrays and the fixed value, so that an error in which the first data value is changed to the second data value can be corrected.

5. The non-volatile semiconductor memory device as claimed in claim 4, further comprising:
    a failure address memory circuit which stores an address of a defective memory cell transistor which is located in one of the first and second memory cell arrays; and
    a compare circuit which compares the address stored in the failure address memory circuit with the address externally supplied and determines whether both addresses coincide with each other,
    the decision circuit changing the fixed value from the first data value to the second data value if the compare circuit determines that both the addresses coincide with each other.

6. The non-volatile semiconductor memory device as claimed in claim 1, further comprising:
    a failure address memory circuit which stores an address of a defective memory cell transistor which is located in one of the first and second memory cell arrays; and
    a compare circuit which compares the address stored in the failure address memory circuit with the address externally supplied and determines whether both addresses coincide with each other,
    the decision circuit changing the fixed value to another fixed value if the compare circuit determines that both the addresses coincide with each other.

7. A non-volatile semiconductor memory device comprising:
    a first memory cell array;
    a second memory cell array that can be accessed by an address identical to that for the first memory cell array; and
    a logic gate which executes a logic operation on data stored in the first and second memory cell arrays,
    wherein the data stored in the first and second memory cell arrays is arranged so as to have performance so that a first data value may mistakenly be changed to a second data value with a possibility higher than the second data value may be changed to the first data value, a result of the logic operation being output data to be externally output.

8. The non-volatile semiconductor memory device as claimed in claim 7, wherein the logic gate is an OR gate.

9. The non-volatile semiconductor memory device as claimed in claim 7, wherein the logic gate is an AND gate.

10. The non-volatile semiconductor memory device as claimed in claim 7, wherein the logic gate comprises:
    an OR gate performing an OR operation on the data stored in the first and second memory cell arrays;
    an AND gate performing an AND operation on the data stored in the first and second memory cell arrays; and
    a selector which selects one of results of the OR and AND gates, a selected result being output data to be externally output.

* * * * *